RECEIVER HAVING CHANNEL SELECTOR-CONTROLLED MEANS FOR REDUCING SENSITIVITY FOR CHANNELS NOT TO BE USED
Filed Sept. 26, 1962
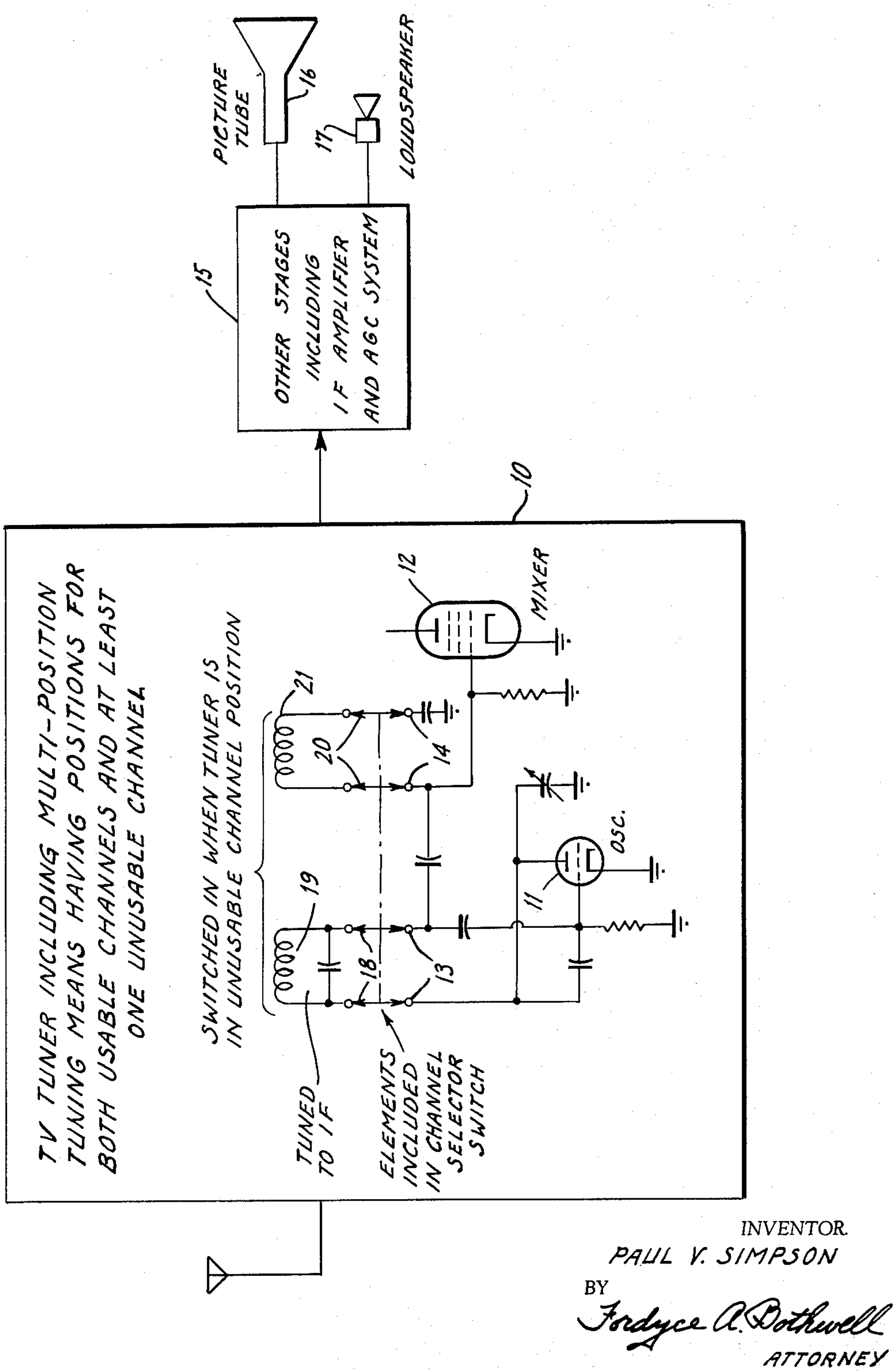
INVENTOR.
PAUL V. SIMPSON
BY
Fordyce A. Bothwell
ATTORNEY 3,243,710
Patented Mar. 29, 1966

3,243,710

RECEIVER HAVING CHANNEL SELECTOR-CONTROLLED MEANS FOR REDUCING SENSITIVITY FOR CHANNELS NOT TO BE USED

Paul V. Simpson, Philadelphia, Pa., assignor to Philco Corporation, Philadelphia, Pa., a corporation of Delaware Filed Sept. 26, 1962, Ser. No. 226,230
4 Claims. (Cl. 325—456)

This invention relates to television receivers and more particularly to prevention therein of the production of objectionable sound when the receiver is tuned through unusable channels, i.e. channels which cannot be received at the location of the receiver.

In tuning a television receiver from one usable channel to another, it is usually necessary to tune through one or more unusable channels. On such occasions some receivers are prone to produce an objectionable loud hissing sound due to thermal noise when the tuner is in a position for an unusable channel. For example this tendency is prevalent in remotely controlled receivers.

One object of the present invention is to overcome this objection.

Another object of the invention is to prevent the production of the objectionable sound by rendering the receiver insensitive to noise when the tuner is in a position for an unusable channel.

While this invention contemplates broadly the provision of means for automatically rendering the receiver insensitive to noise when the tuner is in a position for an unusable channel, in the preferred form of the invention this result is achieved by novel use of the receiver's local oscillator and automatic gain control system. More particularly, in the preferred embodiment of the invention provision is made for tuning the local oscillator to the intermediate frequency when the tuner is in a position for an unusable channel, and the strong signal thus produced causes the AGC system to reduce the gain of the receiver sufficiently to render it insensitive to noise.

The invention may be fully understood from the following detailed description with reference to the accompanying drawing wherein the single figure is a diagrammatic illustration of a television receiver including a preferred embodiment of the invention.

Referring more particularly to the drawing, block 10 represents a conventional tuner modified to embody the present invention. Tube 11 is the usual local oscillator and tube 12 is the usual mixer or converter. In the conventional tuner represented by block 10 the channel selection tuning is effected by the channel selector switch which serves to connect appropriate elements to the terminals 13 and 14. In the absence of this invention the switch would connect the appropriate elements to said terminals in all of its positions including those for unusable channels, but of course the receiver could not receive the latter channels.

Block 15 represents the other conventional stages of the television receiver including the IF amplifier and the AGC system. The picture tube is represented at 16 and the loud speaker is represented at 17.

In accordance with the present invention, provision is made for rendering the receiver insensitive to noise when the tuner is in a position for an unusable channel. In the preferred form of the invention, provision is made for tuning the local oscillator 11 to the intermediate frequency when the selector switch is in a position for an unusable channel. As illustrated, contacts 18 of the selector switch serve to connect into the oscillator circuit a tank circuit 19 which is tuned to the intermediate frequency, and contacts 20 serve to connect a suitable grid coil 21 to the mixer. The oscillator produces a strong signal at the intermediate frequency which causes the AGC system to develop a strong bias in the IF channel and thus reduces the sensitivity of the receiver so that it is insensitive to noise.

It will be understood of course that for usable channels the channel selector switch will serve its usual purpose.

It will be apparent from the foregoing description that the modification of the tuner stage according to the preferred embodiment of this invention merely involves substitution of the elements 19 and 21 for the elements normally employed for each unusable channel position of the selector switch.

While a preferred embodiment of the invention has been illustrated and described, it will be understood that the invention is not limited thereto but contemplates such modifications and other embodiments as may occur to those skilled in the art.

I claim:

1. In a television receiver; a tuner stage including multi-position channel-selector switch means having positions for both usable channels and at least one unusable channel; other stages connected to said tuner stage, including an automatic gain control system; and means rendered operative by said switch means in its position for said unusable channel for causing said automatic gain control system to render the receiver insensitive to noise.

2. In a television receiver; a tuner stage including multi-position tuning means having positions for both usable channels and at least one unusable channel; other stages connected to said tuner stage, including an intermediate frequency amplifier and an automatic gain control system; and means rendered operative by said tuning means in its position for said unusable channel for supplying to said other stages a strong signal at the intermediate frequency, thereby to cause said automatic gain control system to render the receiver insensitive to noise.

3. In a television receiver; a tuner stage including a tunable local oscillator and multi-position tuning means having positions for both usable channels and at least one unusable channel; other stages connected to said tuner stage, including an intermediate frequency amplifier and an automatic gain control system; and means rendered operative by said tuning means in its position for said unusable channel for tuning said oscillator to the intermediate frequency, thereby to cause said automatic gain control system to render the receiver insensitive to noise.

4. In a signal receiver, a tuner stage including an oscillator and a mixer for conversion of incoming signals to an intermediate frequency, other stages connected to said tuner stage including an intermediate frequency amplifier and an associated automatic gain control system for controlling the gain of said amplifier, said automatic gain control system being responsive to signals at the intermediate frequency, multi-position channel-selector switch means in said tuner stage for tuning said oscillator to different frequencies for the aforementioned conversion, said switch means having positions for both channels to be used and at least one channel not to be used, and means selected by said switch means in the position for said channel not to be used to tune said oscillator to said intermediate frequency, thereby to cause said automatic gain control system to render the receiver insensitive to noise.

References Cited by the Examiner

UNITED STATES PATENTS

| | | | |
|---|---|---|---|
| 2,331,039 | 10/1943 | Mitchell | 325—456 |
| 2,602,855 | 7/1952 | Cunningham | 325—456 X |
| 2,809,288 | 10/1957 | Gilbert | 325—453 |
| 3,099,808 | 7/1963 | Hobley | 334—50 |

ROBERT H. ROSE, *Primary Examiner.*

D. C. REDINBAUGH, *Examiner.*

E. C. MULCAHY, Jr., S. J. BOR, *Assistant Examiners.*